(12) United States Patent
Li et al.

(10) Patent No.: US 11,508,619 B2
(45) Date of Patent: Nov. 22, 2022

(54) ELECTRICAL CONNECTION STRUCTURE AND METHOD OF FORMING THE SAME

(71) Applicant: Agency for Science, Technology and Research, Singapore (SG)

(72) Inventors: Hongyu Li, Singapore (SG); Ling Xie, Singapore (SG); Ser Choong Chong, Singapore (SG); Sunil Wickramanayaka, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 16/962,146

(22) PCT Filed: Jan. 24, 2019

(86) PCT No.: PCT/SG2019/050039
§ 371 (c)(1),
(2) Date: Jul. 14, 2020

(87) PCT Pub. No.: WO2019/147186
PCT Pub. Date: Aug. 1, 2019

(65) Prior Publication Data
US 2020/0411379 A1   Dec. 31, 2020

(30) Foreign Application Priority Data

Jan. 26, 2018 (SG) .......................... 10201800693R

(51) Int. Cl.
*H01L 21/768* (2006.01)
*H01L 23/48* (2006.01)
*H01L 23/00* (2006.01)

(52) U.S. Cl.
CPC ...... *H01L 21/76898* (2013.01); *H01L 23/481* (2013.01); *H01L 24/03* (2013.01);
(Continued)

(58) Field of Classification Search
CPC ............ H01L 23/481; H01L 21/76898; H01L 2224/02372
See application file for complete search history.

(56) References Cited

U.S. PATENT DOCUMENTS 6,187,652 B1   2/2001   Chou et al.
9,343,390 B2   5/2016   Lin et al.
(Continued)

OTHER PUBLICATIONS

International Search Report for International Application No. PCT/SG2019/050039 dated Apr. 2, 2019, pp. 1-4.
(Continued)

*Primary Examiner* — Dale E Page
*Assistant Examiner* — Wilner Jean Baptiste
(74) *Attorney, Agent, or Firm* — Shackelford, Bowen, McKinley & Norton, LLP

(57) ABSTRACT

Various embodiments may provide a method of forming an electrical connection structure. The method may include forming a cavity on a front surface of a substrate, the substrate including an electrically conductive pad, by etching through the electrically conductive pad. The method may also include forming one or more dielectric liner layers covering an inner surface of the cavity. The method may further include forming a via hole extending from the cavity by etching through the one or more dielectric liner layers, forming one or more further dielectric liner layers covering an inner surface of the via hole. The method may additionally include depositing a suitable electrically conductive material into the cavity and the via hole to form a conductive via having a first portion in the cavity and a second portion in the via hole, a diameter of the first portion different from a diameter of the second portion.

13 Claims, 19 Drawing Sheets

(52) U.S. Cl.
CPC .............. *H01L 24/05* (2013.01); *H01L 24/13* (2013.01); *H01L 2224/02311* (2013.01); *H01L 2224/02372* (2013.01); *H01L 2224/02381* (2013.01); *H01L 2224/0401* (2013.01); *H01L 2224/13024* (2013.01)

(56) References Cited

U.S. PATENT DOCUMENTS

| | | | |
|---|---|---|---|
| 9,646,930 | B2 | 5/2017 | Tezcan et al. |
| 11,217,472 | B2 * | 1/2022 | Or-Bach ............. H01L 27/0688 |
| 11,328,747 | B1 * | 5/2022 | Matsumoto ............ G11B 5/314 |
| 2004/0238927 | A1 | 12/2004 | Miyazawa |
| 2005/0179120 | A1 | 8/2005 | Yamaguchi |
| 2006/0264041 | A1 | 11/2006 | Rigg et al. |
| 2012/0068330 | A1 * | 3/2012 | Oganesian ............. H01L 24/05 |
| | | | 257/698 |
| 2014/0008757 | A1 | 1/2014 | Ramachandran et al. |
| 2016/0013118 | A1 | 1/2016 | Tsai et al. |
| 2016/0284627 | A1 | 9/2016 | Oganesian et al. |

OTHER PUBLICATIONS

Written Opinion of the International Searching Authority for International Application No. PCT/SG2019/050039 dated Apr. 2, 2019, pp. 1-6.

* cited by examiner

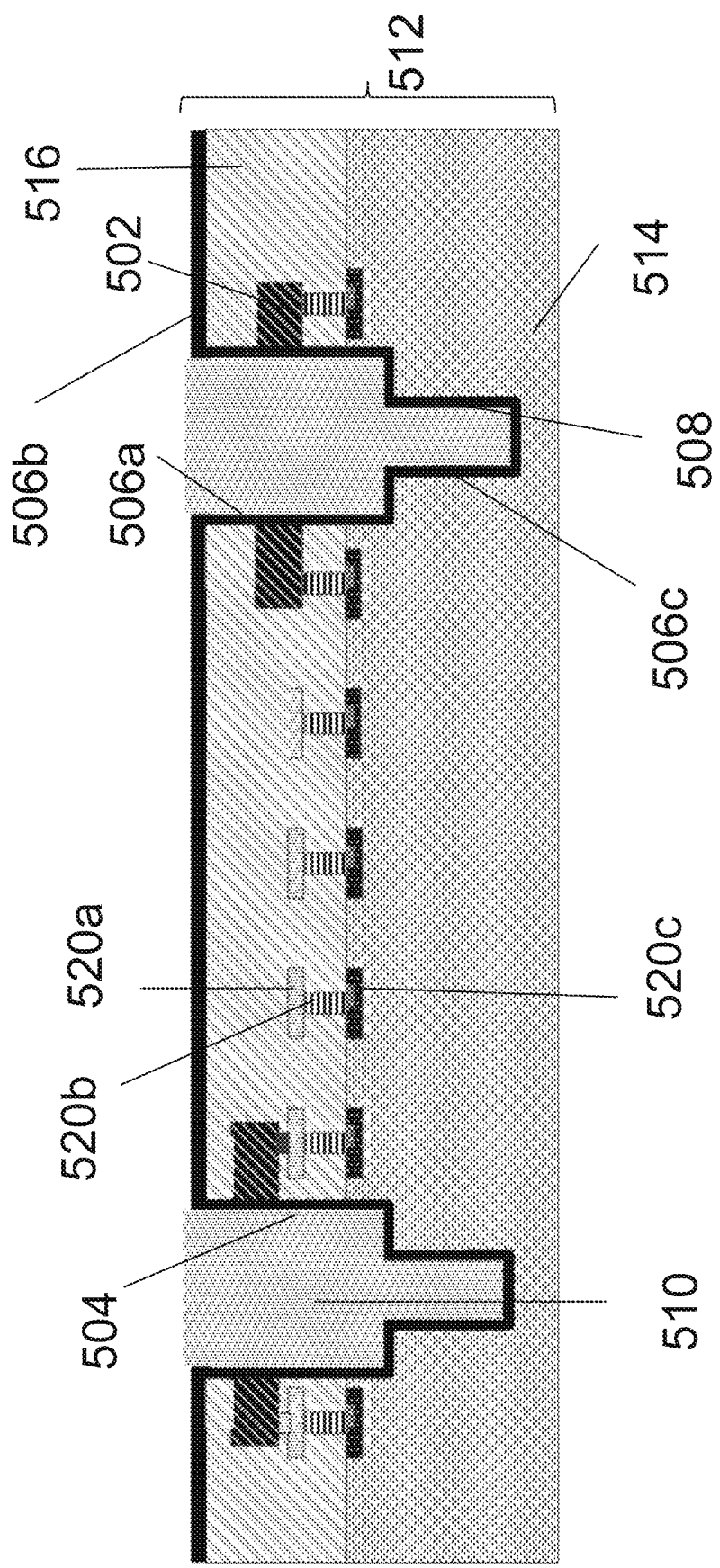

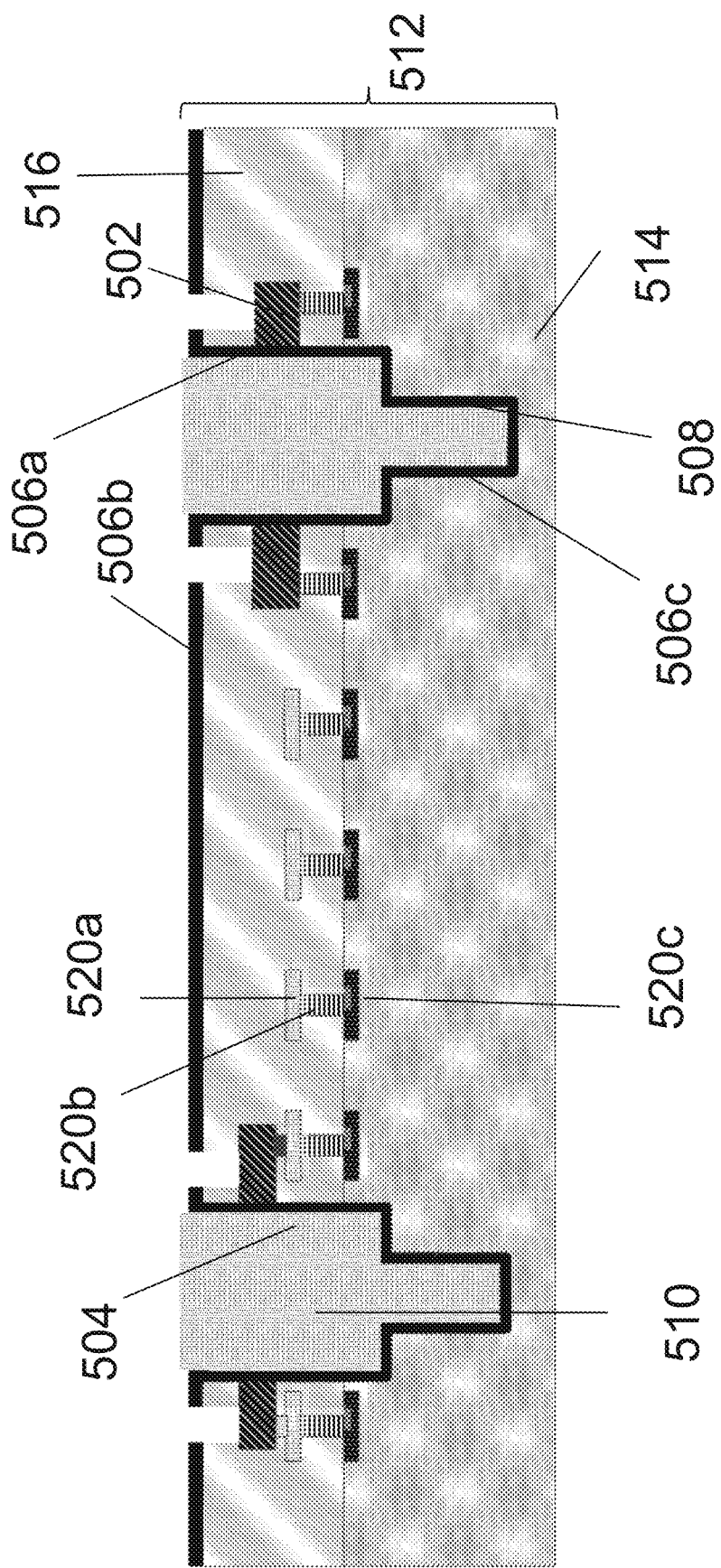

ELECTRICAL CONNECTION STRUCTURE AND METHOD OF FORMING THE SAME

CROSS-REFERENCE TO RELATED APPLICATION

This application claims the benefit of priority of Singapore application No. 10201800693R filed Jan. 26, 2018, the contents of it being hereby incorporated by reference in its entirety for all purposes.

TECHNICAL FIELD

Various aspects of this disclosure relate to an electrical connection structure. Various aspects of this disclosure relate to a method of forming an electrical connection structure.

BACKGROUND

There are many different approaches for through silicon via (TSV) fabrication that include TSV via middle (VM) and TSV via last (VL) fabrication methods. TSV via last fabrication methods may include TSV via last from back (VLFB) and TSV via last from top (VLFT) fabrication methods.

The fabrication of TSV on thinned wafer with bonded carrier wafer may be challenging because the thermal limitation of bonding material (e.g. glue) may need to be considered for VLFB approach. A TSV VLFT approach has been previously developed which involves etching of multiple dielectric layers. Metal and active dummy layers were excluded within TSV design area.

FIG. 1 shows a schematic of multiple stacked dielectric films that were used for 6 metal layers in a back end of line (BEOL) fabrication of logic devices.

In another conventional method, a multi-layer structure may be formed from multiple pre-fabricated power and signal substrates which are bonded together. A drill may then be used to form a via-hole through the surface of a ring-type pad down to a desired depth in the multi-layer structure. The ring-type pads were designed and used for the signal and power substrates. Laser drilling and plasma etching were used for the via-hole formation. Both approaches avoid metal etching within the drilling process by using ring-type pads.

SUMMARY

Various embodiments may provide a method of forming an electrical connection structure. The method may include forming a cavity on a front surface of a substrate, the substrate including an electrically conductive pad, by etching through the electrically conductive pad. The method may also include forming one or more dielectric liner layers covering an inner surface of the cavity. The method may further include forming a via hole extending from the cavity by etching through the one or more dielectric liner layers. The method may also include forming one or more further dielectric liner layers covering an inner surface of the via hole. The method may additionally include depositing a suitable electrically conductive material into the cavity and the via hole to form a conductive via having a first portion in the cavity and a second portion in the via hole, a diameter of the first portion different from a diameter of the second portion.

Various embodiments may provide an electrical connection structure. The electrical connection structure may include an electrically conductive pad included in a substrate. The electrical connection structure may also include a cavity on a front surface of the substrate, the cavity extending through the electrically conductive pad. The electrical connection structure may also include one or more dielectric liner layers covering an inner surface of the cavity. The electrical connection structure may additionally include a via hole extending from the cavity through the one or more dielectric liner layers. The electrical connection structure may also include one or more further dielectric liner layers covering an inner surface of the via hole. The electrical connection structure may further include a conductive via including a suitable electrically conductive material, the conductive via having a first portion in the cavity and a second portion in the via hole, a diameter of the first portion different from a diameter of the second portion.

BRIEF DESCRIPTION OF THE DRAWINGS

The invention will be better understood with reference to the detailed description when considered in conjunction with the non-limiting examples and the accompanying drawings, in which:

FIG. 5C shows forming of a via hole according to various embodiments.

FIG. 5F shows the removal of the capping layer according to various embodiments.

DETAILED DESCRIPTION

Figure 1:
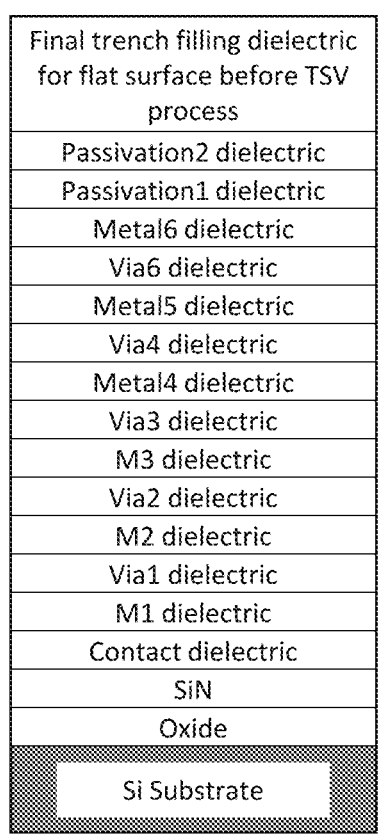
FIG. 1 shows a schematic of multiple stacked dielectric films that were used for 6 metal layers in a back end of line (BEOL) fabrication of logic devices.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or devices/structures are analogously valid for the other methods or devices/structures. Similarly, embodiments described in the context of a method are analogously valid for a device/structure, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers. Further, in the current context, a layer "over" or "on" a side or surface may not necessarily mean that the layer is above a side or surface. A layer "on" a side or surface may mean that the layer is formed in direct contact with the side or surface, and a layer "over" a side or surface may mean that the layer is formed in direct contact with the side or surface or may be separated from the side or surface by one or more intervening layers.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Various embodiments may provide a method in which a TSV cavity is etched from the front surface of the substrate or wafer. Various embodiments may involve a conventional silicon wafer. Various embodiments may have less handling issues as compared to prior art processes involving thinned or bonded wafers.

Figure 2:
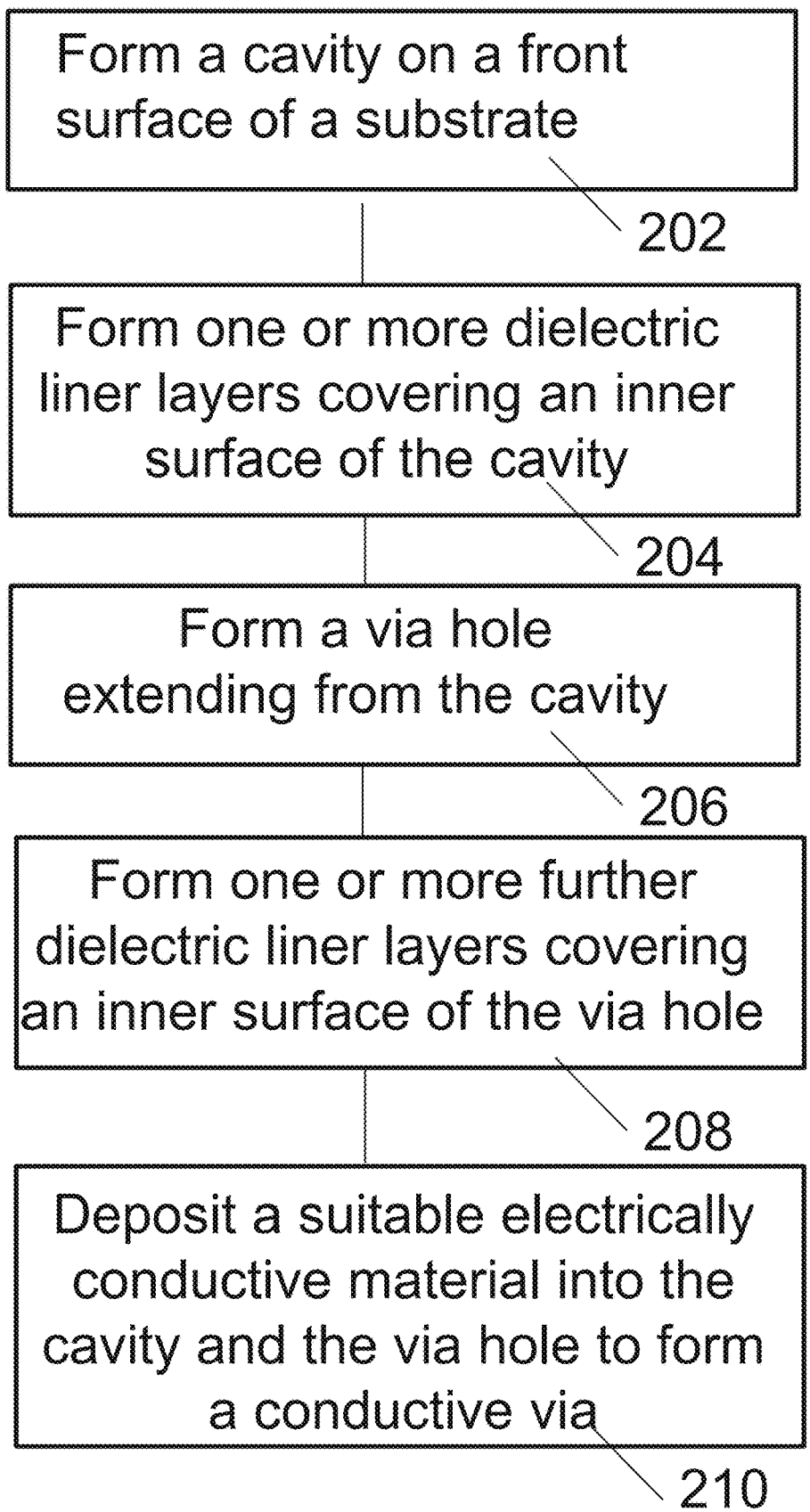
FIG. 2 is schematic showing a method of forming an electrical connection structure according to various embodiments.

FIG. 2 is schematic showing a method of forming an electrical connection structure according to various embodiments. The method may include, in 202, forming a cavity on a front surface of a substrate, the substrate including an electrically conductive pad, by etching through the electrically conductive pad. The method may also include, in 204, forming one or more dielectric liner layers covering an inner surface of the cavity. The method may further include, in 206, forming a via hole extending from the cavity by etching through the one or more dielectric liner layers. The method may further include, in 208, forming one or more further dielectric liner layers covering an inner surface of the via hole. The method may additionally include, in 210, depositing a suitable electrically conductive material into the cavity and the via hole to form a conductive via having a first portion in the cavity and a second portion in the via hole, a diameter of the first portion different from a diameter of the second portion.

In other words, the method of forming an electrical connection structure may include etching through the electrically conductive pad to form a cavity, forming one or more dielectric liner layers within the cavity, forming a via hole extending from the cavity by removing a portion of the one or more dielectric liner layers, forming one or more further dielectric liner layers within the via hole, and depositing a suitable electrically conductive material to form a conductive via with a first portion and a second portion of different diameters.

The conductive via may also be referred to as an electrically conductive via. The second portion of the conductive via contained in the via hole may be a through silicon via (TSV). The first portion of the conductive via contained in the cavity may be a TSV cavity portion.

In various embodiments, a diameter of the first portion may be greater than a diameter of the second portion.

In various embodiments, the substrate may include a carrier (e.g. a silicon carrier), and a substrate dielectric layer including one or more dielectric sub-layers on the carrier. The front surface of the substrate may be a surface of the substrate dielectric layer opposite the surface in contact with the carrier. In various embodiments, the forming of the cavity, e.g. the TSV cavity, may include etching of multiple substrate dielectric layers. Silicon may act as an etch stop. Further, in various embodiments, even if the silicon carrier is over etched, the impact to the process may not be great.

In various embodiments, the method may also include providing a through via mask over the one or more dielectric liner layers after forming the one or more dielectric liner layers (i.e. to cover the inner surface of the cavity) and before forming the via hole so that the through via mask exposes at least a portion of the one or more dielectric liner layers covering a portion of a bottom surface of the cavity for subsequent forming of the via hole.

The through via mask may cover a remaining portion of the one or more dielectric liner layers.

In various embodiments, the one or more dielectric liner layers (alternatively referred to as liners) and/or the one or more further dielectric liner layers may use the back end of line (BEOL) processes. The one or more dielectric liner layers and/or the one or more further dielectric liner layers may be formed at a higher temperature of about 400° C. The properties of the one or more dielectric liner layers and/or the one or more further dielectric liner layers according to various embodiments may be better than low temperature tetraethyl orthosilicate (TEOS), which may typically be formed at a lower temperature below 200° C.

In various embodiments, the one or more dielectric liner layers and/or the one or more further dielectric liner layers may be a silicon nitride (SiN) layer. In various other embodiments, the one or more dielectric liner layers and/or the one or more further dielectric liner layers may be an oxide layer, e.g. a silicon oxide layer, and a silicon nitride (SiN) layer on the oxide layer.

In various embodiments, the one or more further dielectric liner layers or liners at a bottom surface of via hole may be removed by backside chemical mechanical polishing in the VLFT approach, which may be less of a challenge in terms of ease of processing.

Various embodiments may include annealing at a high temperature selected from a range of 300° C. to 400° C. for improving a thermal stability of the conductive via (referred to as TSV) in subsequent processes.

In the current context, an "inner surface" of the cavity may refer to a bottom surface of the cavity and/or a side wall of the cavity. The "inner surface" of the cavity may also be referred to as an inner wall of the cavity. By providing the through via mask over the one or more dielectric liner layers such that a portion of the one or more dielectric liner layers that covers a portion of the bottom surface is still exposed, the portion of the one or more dielectric liner layers may subsequently be removed (e.g. via etching), thereby exposing the underlying portion of the bottom surface, i.e. part of the substrate under portion of bottom surface, for subsequent removal (e.g. via etching). Likewise, an "inner surface" of the via hole may refer to a bottom of the via hole and/or a side wall of the via hole.

Forming the via hole may include etching the portion of the one or more dielectric liner layers and the portion of the bottom surface of the cavity (i.e. part of the substrate under portion of bottom surface).

The cavity may be used to reduce or prevent multiple layer etched sidewall profile being transferred to an inner surface of the via hole. The TSV cavity may be formed on the substrate dielectric layer including a plurality of dielectric sub-layers over the silicon carrier. As such, the side walls of the TSV cavity may have a multiple layer etched sidewall profile. The critical dimension (CD) of the via hole may be smaller than the CD of the cavity, and the sidewall of the cavity may be covered by photoresist (PR) during etching of the via hole. As such, the multiple layer etched sidewall profile may not be transferred to the via hole.

The method may also include depositing an oxide over the front surface of the substrate and conducting or performing chemical mechanical polishing (CMP) on the deposited oxide to form a planarized cover oxide layer before forming the cavity such that the planarized cover oxide layer is over the electrically conductive pad. The method may also include providing a cavity mask over the planarized cover oxide layer after forming the planarized cover oxide layer and before forming the cavity. The cavity mask may expose a portion of the planarized cover oxide layer over a portion of the electrically conductive pad for etching of the portion of the planarized cover oxide layer and the portion of the electrically conductive pad to form the cavity. The cavity mask may cover a remaining portion of the planarized cover oxide layer.

In various embodiments, the suitable electrically conductive material may be a metal such as copper or tungsten, or doped polysilicon. In other words, the suitable electrically conductive material may be selected from a group consisting of copper, tungsten, and doped polysilicon. In various other embodiments, the electrically conductive material may be any other suitable material.

The method may also include forming a redistribution layer over the front surface of the substrate, the redistribution layer connecting the electrically conductive pad and the conductive via. The redistribution layer may include one or more electrically conductive lines to electrically connect the electrically conductive pad and the conductive via.

The method may also include conducting or performing chemical mechanical polishing (CMP) on the front surface of the substrate after depositing the suitable electrically conductive material. The method may further include forming a capping layer over the front surface of the substrate after conducting or performing the chemical mechanical polishing (CMP). The capping layer may include a material such as silicon nitride. The method may additionally include providing a passivation mask over the capping layer so that at least a portion of the capping layer is exposed. The method may further include removing the portion of the capping layer and a portion of the substrate over a portion of the electrically conductive pad via etching so that the portion of the conductive pad is exposed. The method may further include removing a remaining portion of the capping layer to expose the conductive via. The method may also include forming the redistribution layer including the one or more electrically conductive lines to electrically connect the exposed portion of the conductive pad and the exposed portion of the conductive via. In other words, the one or more electrically conductive lines may electrically connect the electrically conductive pad and the conductive via.

The method may also include removing the portion of the capping layer via etching so that at least a portion of the conductive pad and at least a portion of the conductive via are exposed. The method may further include forming the redistribution layer comprising the one or more electrically conductive lines to electrically connect the exposed portion of the electrically conductive pad and the exposed portion of the conductive via.

The method may additionally include forming an under bump metallization on the redistribution layer. The under bump metallization may be in contact with the one or more electrically conductive lines.

In various embodiments, the method may additionally include removing a portion of the substrate so that a back surface of the substrate opposite the front surface is formed to expose the conductive via.

In various embodiments, the method may also include forming a backside metallization so that the backside metallization is in contact with the conductive via.

The electrically conductive pad may include aluminum or copper.

In various embodiments, the electrical connection structure may be formed by a via last from top (VLFT) approach.

In various embodiments, the conductive via may connect active devices through the redistribution layer (i.e. which may be referred to as the front side RDL). The annealing processes may have less effect on back end of line (BEOL) horizontal connections.

Various embodiments may provide an electrical connection structure formed by a method as described herein.

Figure 3:
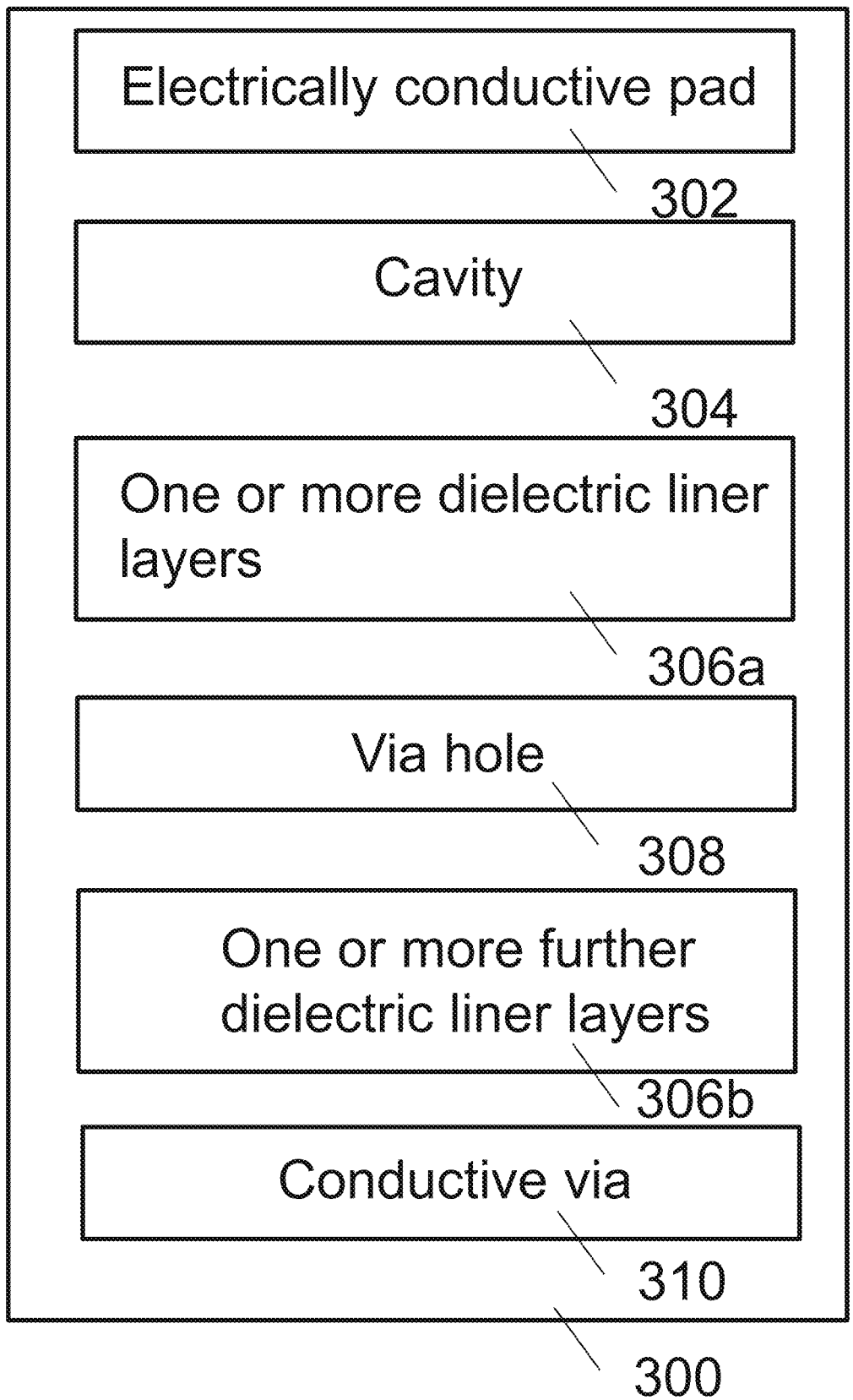
FIG. 3 shows a general illustration of an electrical connection structure according to various embodiments.

FIG. 3 shows a general illustration of an electrical connection structure 300 according to various embodiments. The electrical connection structure 300 may include an electrically conductive pad 302 included in a substrate. The electrical connection structure 300 may also include a cavity 304 on a front surface of the substrate, the cavity 304 extending through the electrically conductive pad 302. The electrical connection structure 300 may also include one or more dielectric liner layers 306a covering an inner surface of the cavity 304. The electrical connection structure 300 may additionally include a via hole 308 extending from the cavity 304 through the one or more dielectric liner layers 306a. The electrical connection structure 300 may also include one or more further dielectric liner layers 306b covering an inner surface of the via hole 308. The electrical connection structure 300 may further include a conductive via 310 including a suitable electrically conductive material, the conductive via 310 having a first portion in the cavity 304 and a second portion in the via hole 308, a diameter of the first portion different from a diameter of the second portion.

In other words, the electrical connection structure 300 may include a conductive via 310 including a suitable electrically conductive material, the conductive via 310 having a first portion and a second portion. The first portion and the second portions may be of different diameters. The first portion may be defined at least partially by the cavity 304, and the second portion may be defined at least partially by the via hole 308. The cavity 304 may extend through the electrically conductive pad 302. The electrical connection structure 300 may also include one or more dielectric liner layers 306a, as well as one or more further dielectric layers 306b. The via hole 308 may extend from the cavity 304 through the one or more dielectric liner layers 306.

FIG. 3 serves to represent features of an electrical connection structures, and may not denote or limit a particular arrangement or layout of the features.

In various embodiments, a diameter of the first portion may be greater than a diameter of the second portion.

In various embodiments, the conductive via may extend from the front surface of the substrate to a back surface of the substrate opposite the front surface.

In various embodiments, the electrical connection structure 300 may include a redistribution layer including one or more electrically conductive lines connecting the electrically conductive pad 302 and the conductive via 310.

In various embodiments, the electrical connection structure 300 may also include a backside metallization so that the conductive via is between the backside metallization and the redistribution layer. The electrical connection structure 300 may also include one or more solder bumps in contact with the backside metallization.

Figure 4A:
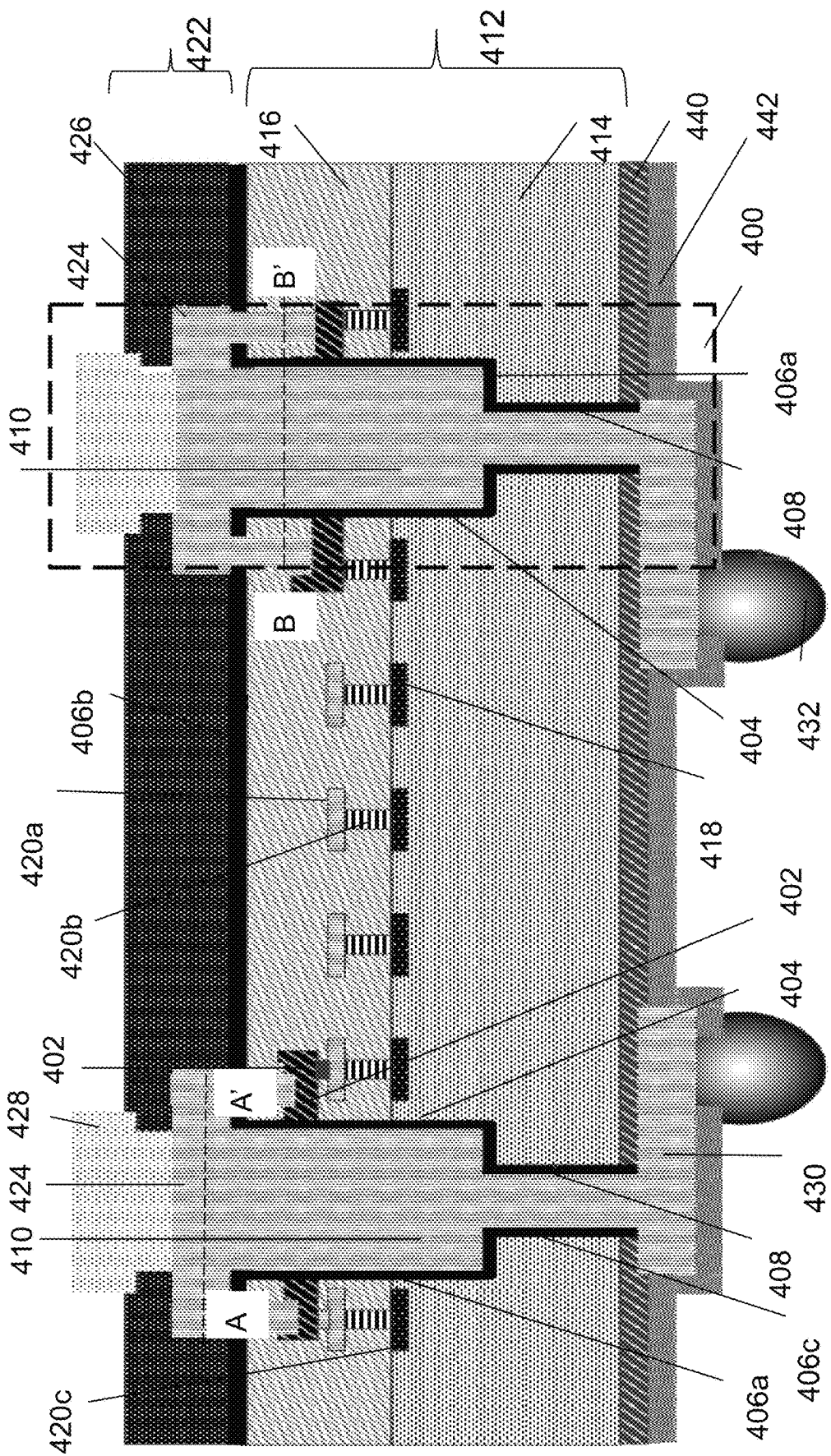
FIG. 4A is a cross-sectional schematic of a device including an electrical connection structure according to various embodiments.

FIG. 4A is a cross-sectional schematic of a device including an electrical connection structure 400 according to various embodiments. The electrical connection structure 400 may include an electrically conductive pad 402 included in a substrate 412. The electrical connection structure 400 may also include a cavity 404 on a front surface of the substrate 412, the cavity 404 extending through the electrically conductive pad 402. The electrical connection structure 400 may also include one or more dielectric liner layers 406a covering an inner surface of the cavity 404. The electrical connection structure 400 may additionally include a via hole 408 extending from the cavity 404 through the one or more dielectric liner layers 406a. The electrical connection structure 400 may further include a conductive via 410 including a suitable electrically conductive material, the conductive via 410 having a first portion in the cavity 404 and a second portion in the via hole 408, a diameter of the first portion different from a diameter of the second portion. A diameter of the first portion may be greater than a diameter of the second portion. The substrate 412 may include a carrier 414, such as a silicon carrier, and a substrate dielectric layer 416 on the carrier 414. The electrically conductive pad 402 may be embedded in the substrate dielectric layer 416.

The conductive via 410 may extend from the front surface of the substrate 412 to a back surface of the substrate 412 opposite the front surface. The conductive via 410 may be held by the cavity 404 and the via hole 408. The cavity 404 may be defined by sidewalls as well as ledge surfaces. The via hole 408 may be defined by side walls which may extend from the ledge surfaces of the cavity 404. The cavity 404 may be designed on the electrically conductive pad 402, which may be an aluminum (Al) pad. The second portion of the conductive via 410 in the via hole 408 may be a through silicon via (TSV). The first portion of the conductive via 410 may be referred to as a TSV cavity portion. The height of the cavity 404 may be for instance, any value selected from 1 µm to 20 µm.

Figure 4B:
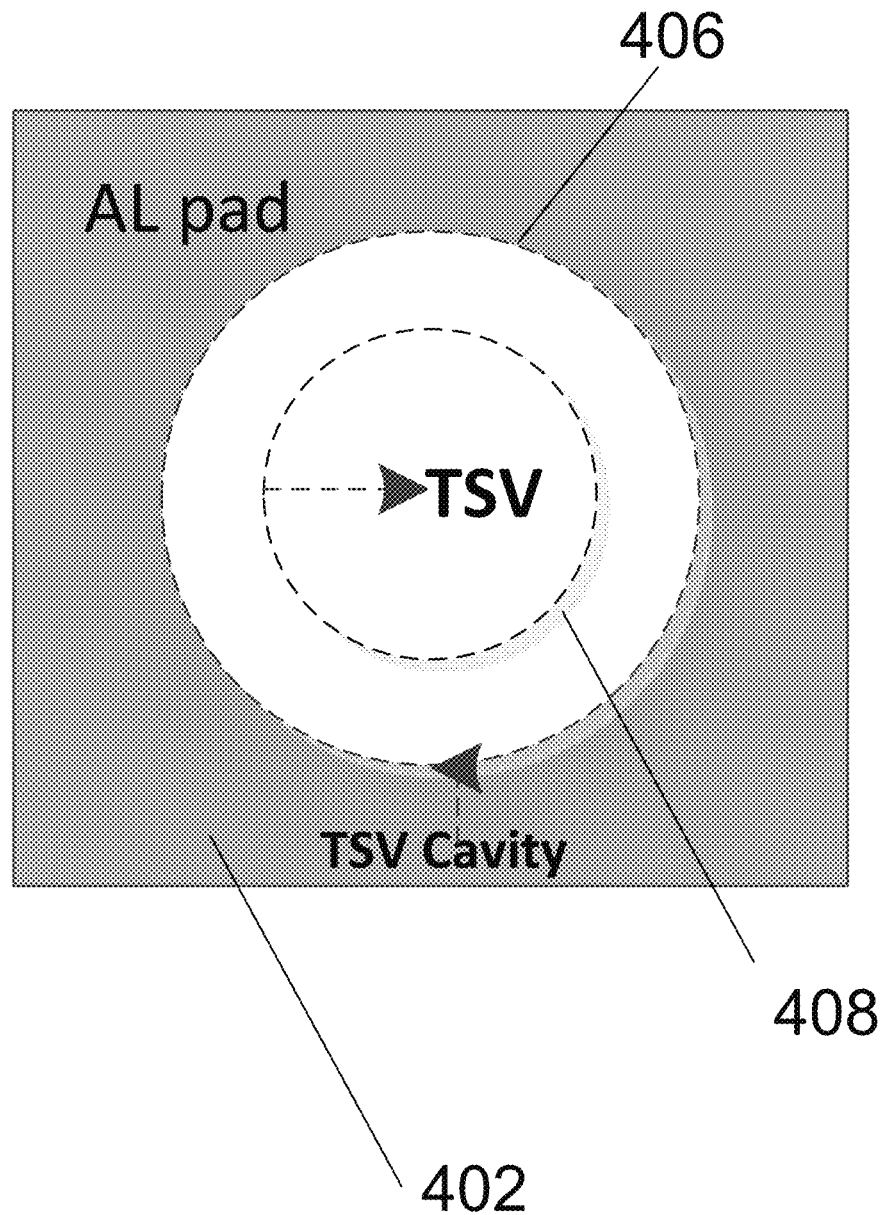
FIG. 4B is a schematic showing a top view of a conductive via according to various embodiments.

FIG. 4B is a schematic showing a top view of a conductive via 410 according to various embodiments. As shown in FIG. 4B, the via hole 408 may be formed at the centre of the cavity 404. The size (or diameter) of the cavity 404 may be greater than the size (or diameter) of the via hole 408. This may prevent or reduce multiple layer etched sidewall profile being transferred during the formation of the via hole 408.

Referring back to FIG. 4A, the electrical connection structure 400 or device may also include a redistribution layer 422 including one or more electrically conductive lines 424 connecting the electrically conductive pad 402 and the conductive via 410. The redistribution layer 422 may further include a dielectric 426 such as polyimide (PI) in contact with the one or more electrically conductive lines 424. The one or more electrically conductive lines 424 may include a metal such as aluminum (Al). The electrical connection structure 400 or device may also include a first backside dielectric layer 440 on or in contact with a back surface of the substrate 412, and a second backside dielectric layer 442 on or in contact with the first backside dielectric layer 440.

Figure 4C:
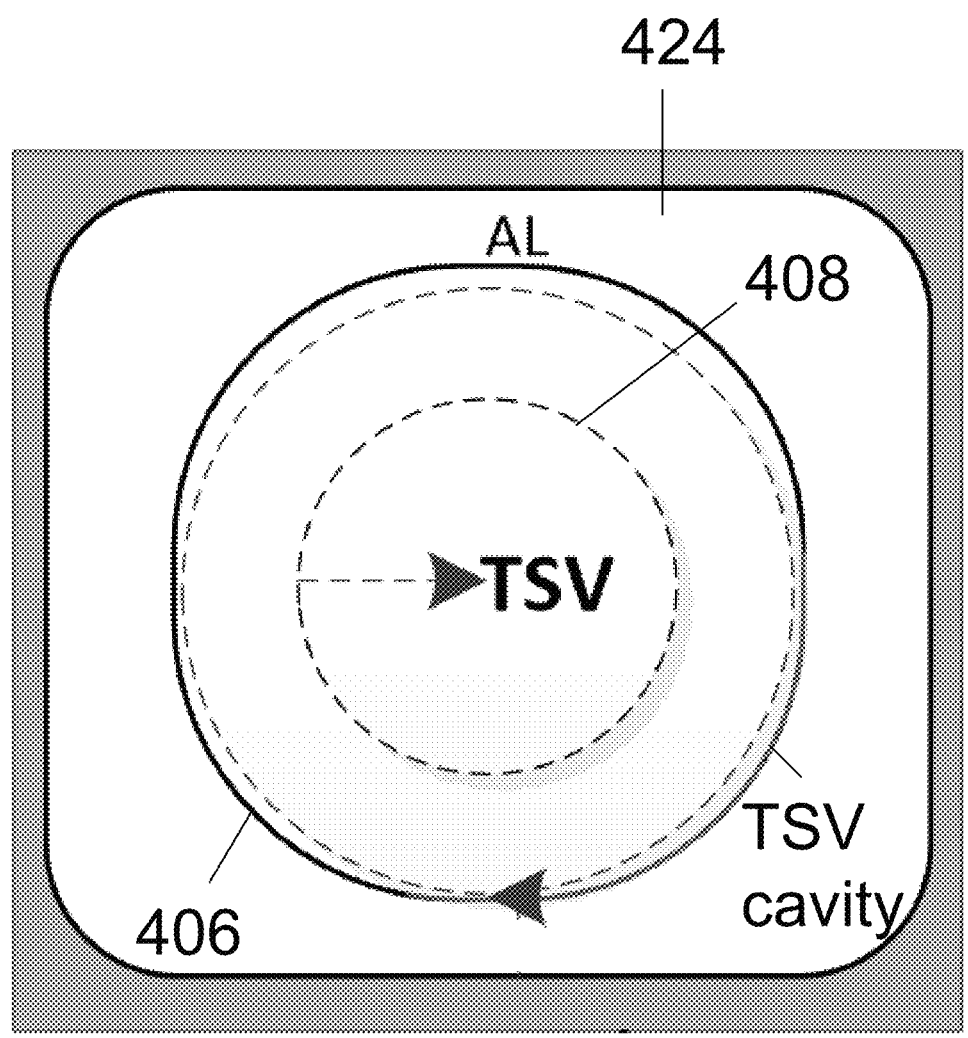
FIG. 4C is a schematic of a connection design of a conductive via with an electrically conductive line according to various embodiments.
Figure 4D:
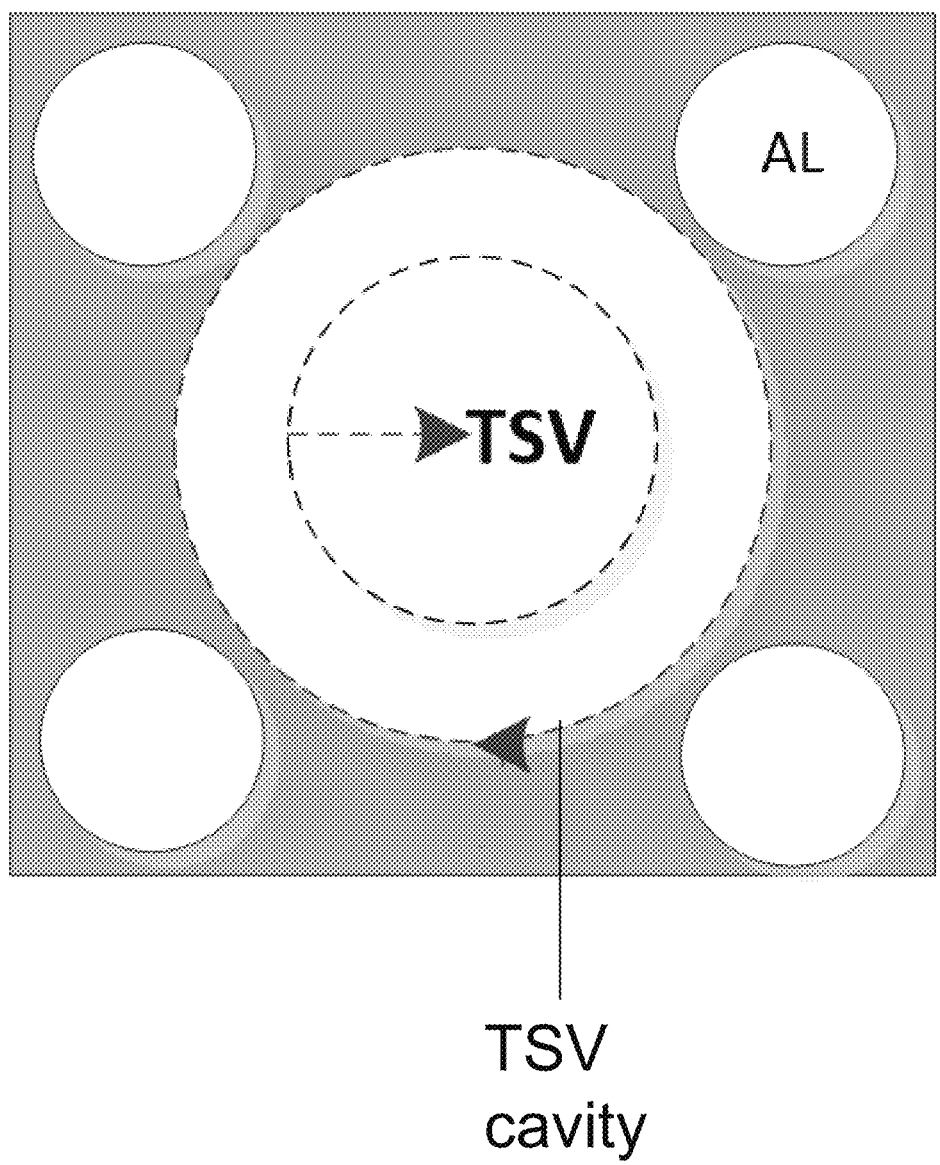
FIG. 4D is another schematic of the connection design of a conductive via with an electrically conductive line according to various embodiments.

FIG. 4C is a schematic of a connection design of a conductive via 410 with an electrically conductive line 424 according to various embodiments. The design shown in FIG. 4C may be the view across line A-A' shown in FIG. 4A. In the connection design shown in FIG. 4C, the electrically conductive line 424 may include a portion (including Al) in contact with the conductive via 410. The portion of the electrically conductive line 424 may have a bigger cross-sectional area compared to the TSV cavity. FIG. 4D is another schematic of the connection design of a conductive via 410 with an electrically conductive line 424 according to various embodiments. The design shown in FIG. 4D may be the view across line B-B' shown in FIG. 4A.

The open area design shown in FIG. 4C may increase contact area while the design shown in FIG. 4D may achieve same or similar contact interface with same or similar opening.

As shown in FIG. 4A, the substrate 412 may also include electrical interconnections 420a, 420b in contact with doped regions 420c. In addition, the device may further include a front side (FS) under bump metallization 428 and a backside (BS) metallization 430 on opposite sides of the substrate 412. The front side (FS) under bump metallization 428 may be in contact with the one or more electrically conductive lines 424 of the redistribution layer, while the backside (BS) metallization 430 may be in contact with the second portion of the conductive via 410. The substrate 412 may also include one or more dielectric layers 406b between the substrate 412 and the redistribution layer 422. The one or more dielectric layers 406b may extend from the one or more dielectric liner layers 406a on the substrate 412 or the substrate dielectric layer 416. In addition, the substrate 412 may also include one or more further dielectric liner layers 406c covering an inner surface of the via hole 408. The one or more further dielectric liner layers 406c may extend from the one or more dielectric line layers 406a.

The device may also include micro-bumps 432 in contact with the backside (BS) metallization 430.

Figure 5A:
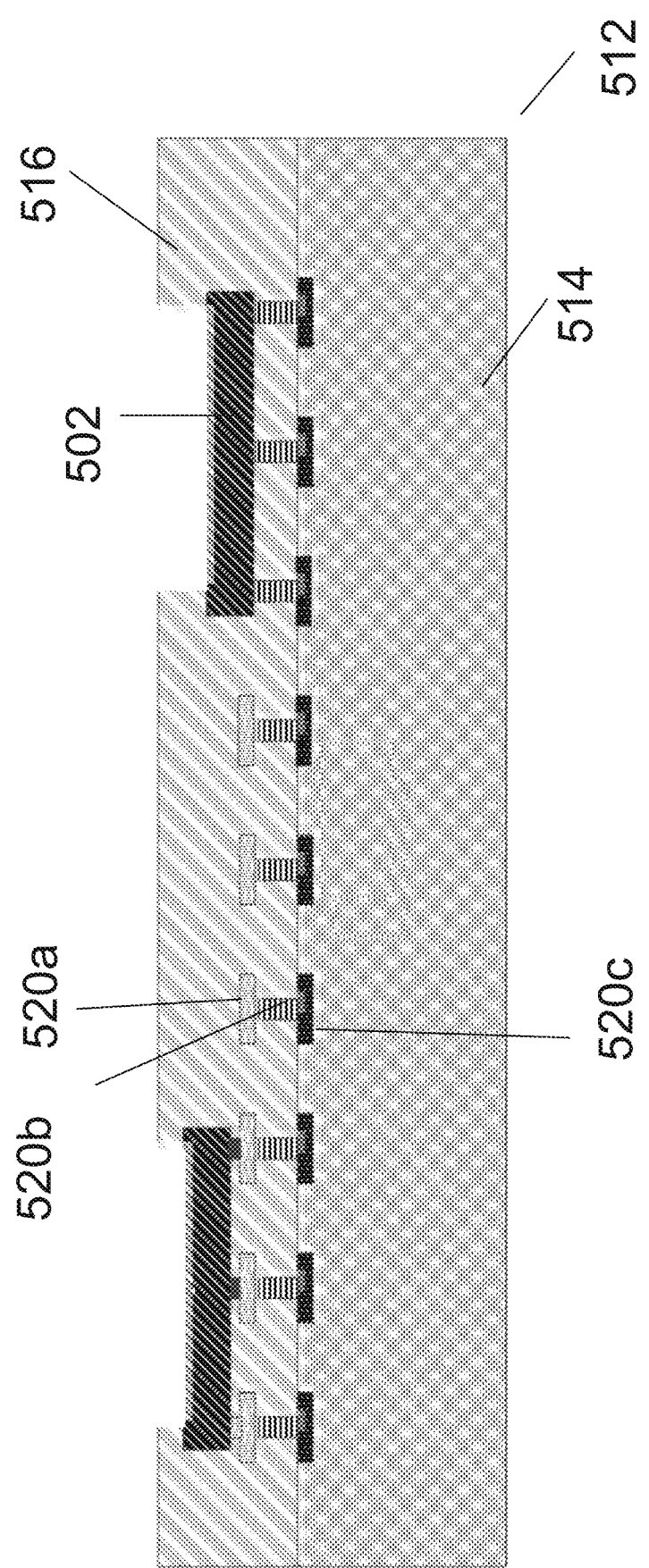
FIG. 5A shows a substrate according to various embodiments.

FIG. 5A shows a substrate 512 according to various embodiments. The substrate 512 may include a carrier 514, which may include doped regions 520c. The substrate 512 may also include a substrate dielectric layer 516 on a carrier 514, e.g. a semiconductor wafer such as a silicon wafer. The substrate 512 or the substrate dielectric layer 516, may include an electrically conductive pad 502 (e.g. aluminum pad or copper pad), as well as electrical interconnections 520a, 520b, e.g. copper interconnections, electrically connecting the doped regions 520c of the carrier 514 with the electrically conductive pad 502.

Figure 5B:
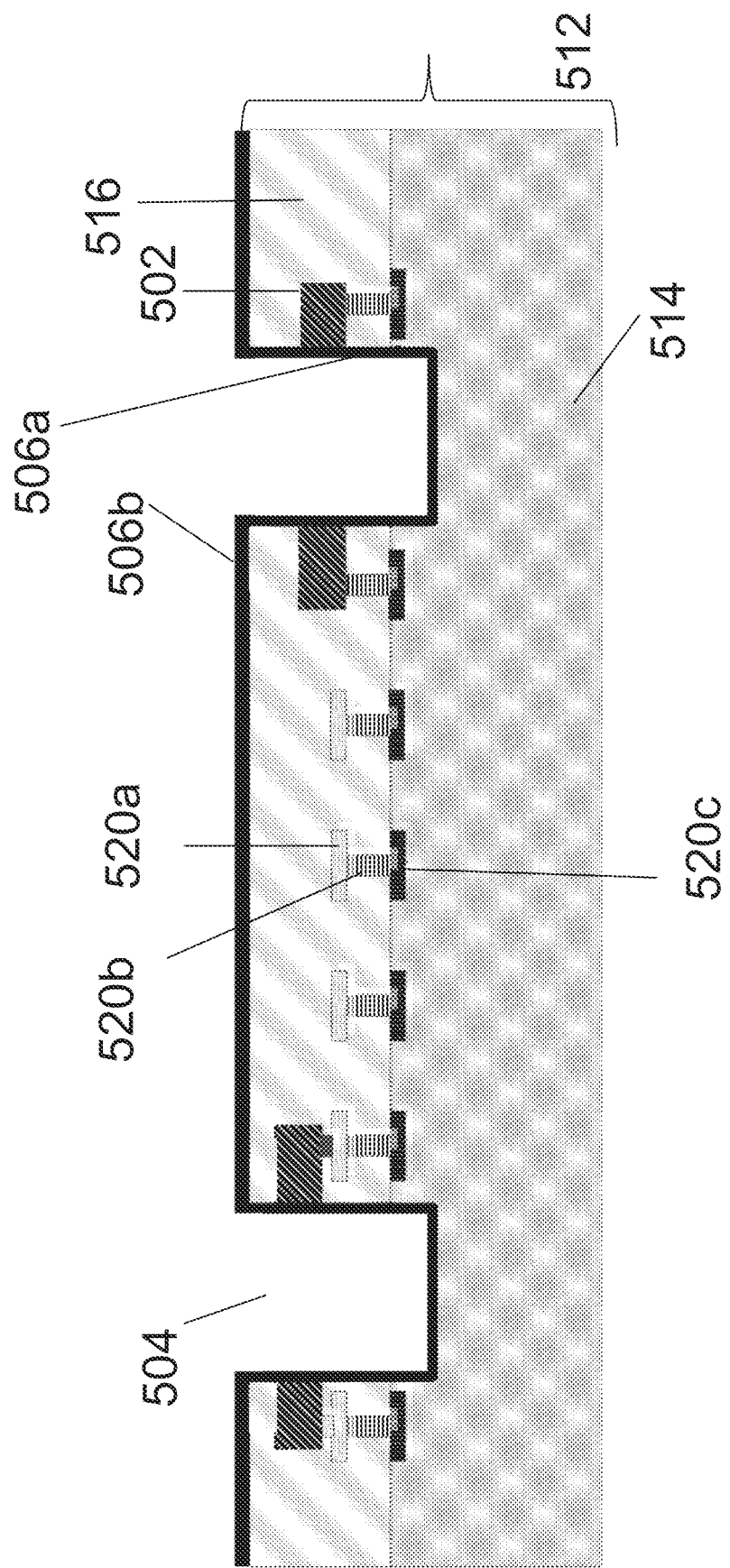
FIG. 5B shows further processing to the substrate shown in FIG. 5A according to various embodiments.

FIG. 5B shows further processing to the substrate 512 shown in FIG. 5A according to various embodiments. A cover oxide layer, e.g. a silicon oxide layer, may be deposited on a front surface of the substrate 512 in contact with the electrically conductive pad 502. A chemical mechanical polishing (CMP) step may then be performed to planarize the cover oxide layer. In other words, the method may include depositing an oxide over the front surface of the substrate 512 and conducting chemical mechanical polishing (CMP) on the deposited oxide to form a planarized cover oxide layer such that the planarized cover oxide layer is over the electrically conductive pad 502. A cavity mask, e.g. a through silicon via (TSV) mask, may be provided or formed over the planarized cover oxide layer after forming the planarized cover oxide layer. The cavity mask may include photoresist. Lithography may be carried out on the photoresist using photolithography to pattern the photoresist. The patterned photoresist may then serve as a mask for subsequent etching of the planarized cover oxide layer and the electrically conductive pad 502. The cavity mask may expose a portion of the planarized cover oxide layer that is over a portion of the electrically conductive pad 502 for etching of the portion of the planarized cover oxide layer and the portion of the electrically conductive pad 502 to form the cavity 504. Etching may be carried out to remove the exposed portion of the planarized cover oxide layer as well as the underlying electrically conductive pad 502. In other words, the method may include forming a cavity 504 on a front surface of a substrate 514, the substrate 514 including an electrically conductive pad 502, by etching through the electrically conductive pad 502 (as well as the portion of the planarized cover oxide layer 516 over the portion of the electrically conductive pad 502 removed). The photoresist may be removed in a photoresist stripping (PRS) step. A wet clean step may be carried out after the PRS step.

The method may also include forming one or more dielectric liner layers 506a covering an inner surface of the cavity 504. Dielectric materials, such as silicon nitride (SiN) and/or silicon oxide ($SiO_2$) may be deposited to form the one or more dielectric liner layers 506a within the cavity 504, as well as one or more dielectric layers 506b outside of the cavity 504. The one or more dielectric layers 506b and the one or more dielectric liner layers 506a may be continuous.

FIG. 5C shows forming of a via hole 508 according to various embodiments. As shown in FIG. 5C, the via hole 508 may extend from the cavity 504. The method may include providing a through via mask (e.g. a through silicon via (TSV) mask) over the one or more dielectric liner layers 506a after forming the one or more dielectric liner layers 506a to cover the inner surface of the cavity 504 and before forming the via hole 508 so that the through via mask exposes at least a portion of the one or more dielectric liner layers 506a covering a portion of a bottom surface of the cavity for subsequent forming of the via hole 508. The through via mask may include photoresist. Lithography may be carried out on the photoresist to pattern the photoresist. The patterned photoresist may then serve as a mask for subsequent etching of the one or more dielectric liner layers 506a to form the via hole 508. The method may include forming the via hole 508 extending from the cavity 504 by etching through the one or more dielectric liner layers 506a. The photoresist may be removed in a photoresist stripping (PRS) step. A wet clean step may be carried out after the PRS step.

The method may also include forming a further dielectric liner layer 506c at an inner surface of the via hole 508 by depositing a dielectric such as $SiO_2$. The deposition may be carried out at a temperature of about 400° C. The further dielectric liner layer 506c may extend continuously from the dielectric liner layer 506b.

The method may also include depositing a suitable electrically conductive material, for instance, a metal such as copper, into the cavity 504 and the via hole 506 to form a conductive via 510 having a first portion in the cavity 504 and a second portion in the via hole 508. One or more barrier layers, such as tantalum (Ta), tantalum nitride (TaN), titanium (Ti), or titanium nitride (TiN) may be deposited in the cavity 504 and the via hole 506. Subsequently, a seed metal layer, including e.g. copper (Cu), may be deposited using a deposition method such as physical vapour deposition (PVD).

The remaining top metal may then be deposited by electrochemical plating (ECP). The method may also include conducting chemical mechanical polishing (CMP) over the front surface of the substrate 512 or on the dielectric layer 506b after depositing the suitable metal, e.g. to remove excess metal protruding from the front surface of the substrate 512 or from the dielectric layer 506b.

Figure 5D:
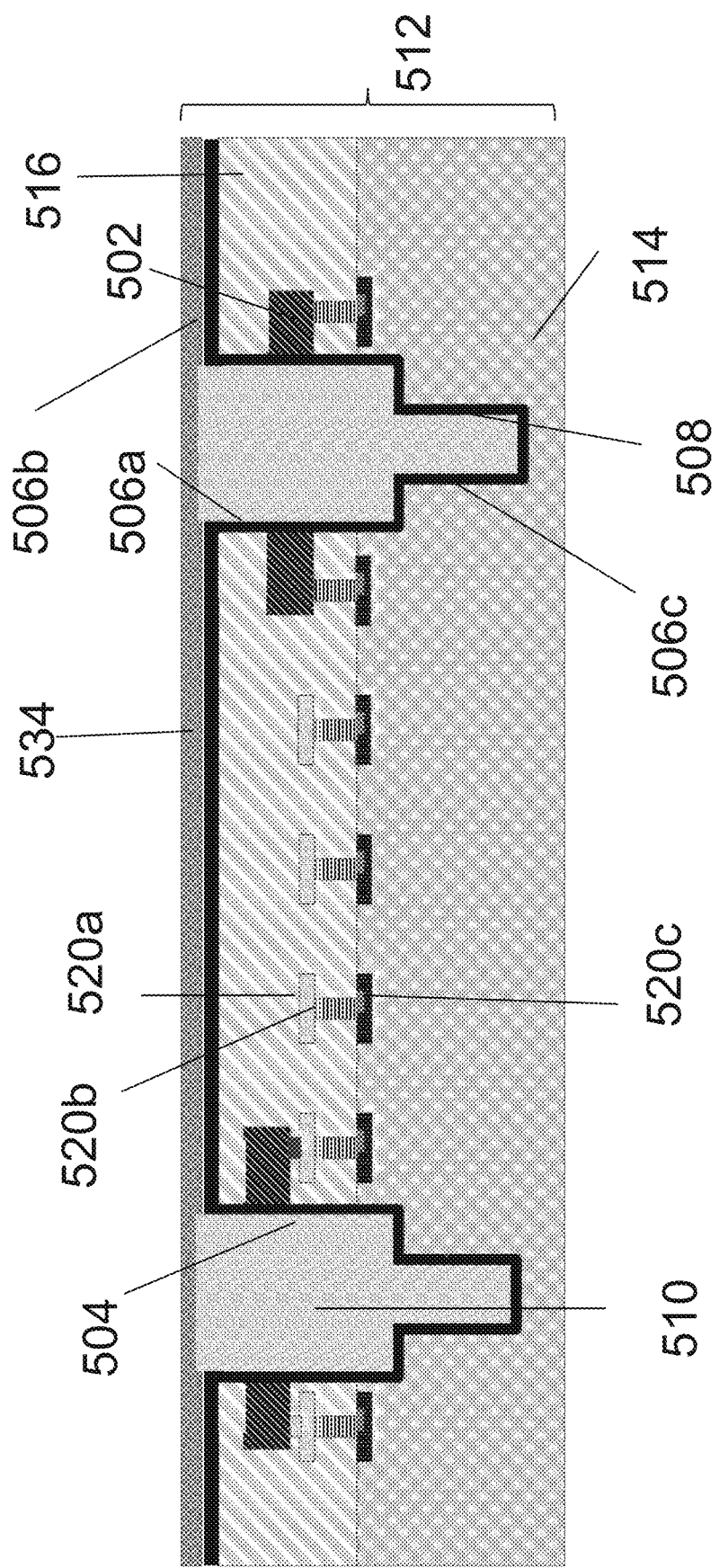
FIG. 5D shows forming of a capping layer according to various embodiments.

FIG. 5D shows forming of a capping layer 534 according to various embodiments. The method may also include forming the capping layer 534 over the front surface of the substrate 512 after conducting the chemical mechanical polishing (CMP). The capping layer 534 may include a dielectric such as silicon nitride.

Figure 5E:
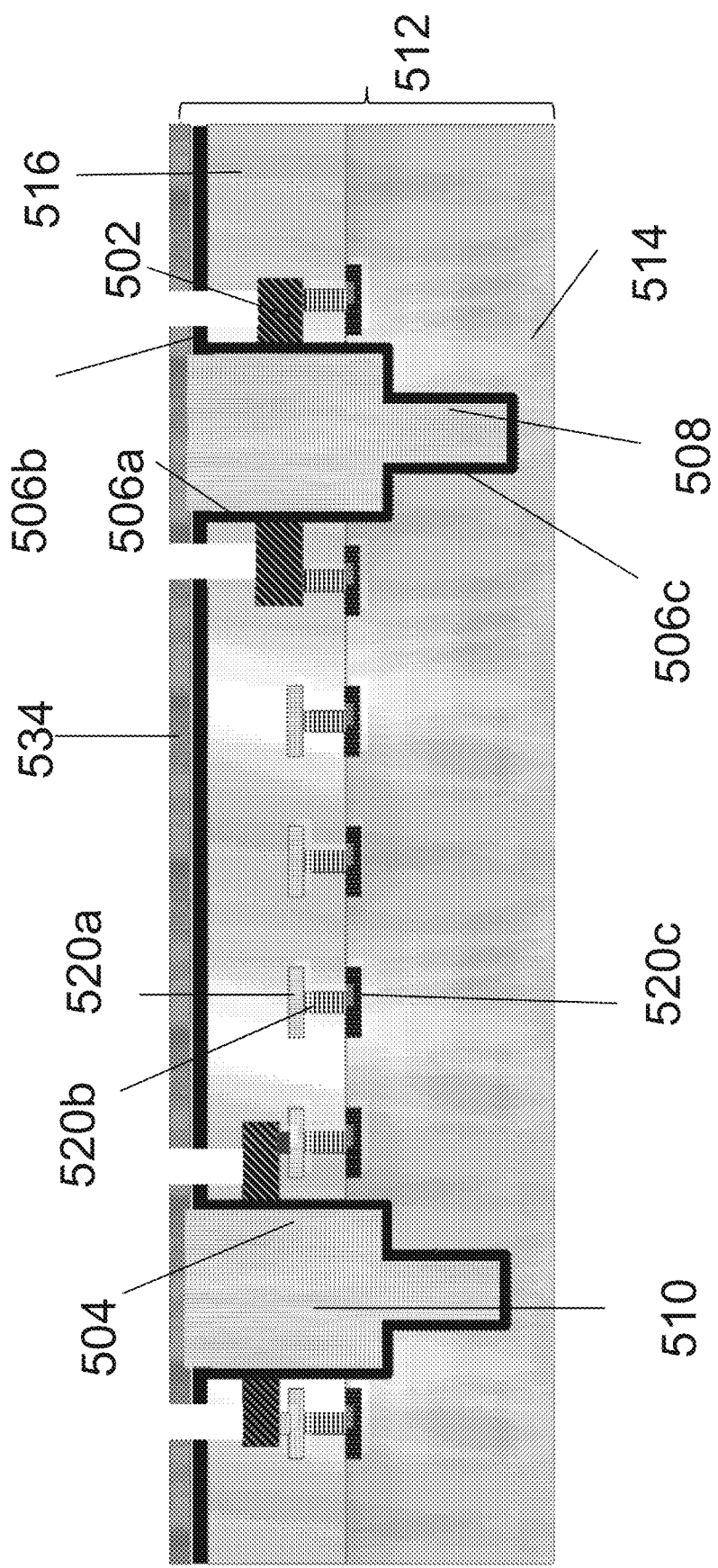
FIG. 5E shows patterning the substrate according to various embodiments.

FIG. 5E shows patterning the substrate 512 according to various embodiments. The method may include providing a passivation mask over the capping layer 534 so that at least a portion of the capping layer 534 is exposed. The passivation mask may include photoresist. Lithography may be carried out on the photoresist using photolithography to pattern the photoresist. The patterned photoresist may then serve as a mask for subsequent etching of the underlying layers. The method may include removing the portion of the capping layer 534 and a portion of the substrate over a portion of the electrically conductive pad 502 (the portion of the substrate is directly under the portion of the capping layer 534) via etching so that at least the portion of the electrically conductive pad 502 is exposed.

FIG. 5F shows the removal of the capping layer 534 according to various embodiments. The removal of the capping layer 534 may expose the dielectric layers 506b as well as the conductive via 510.

Figure 5G:
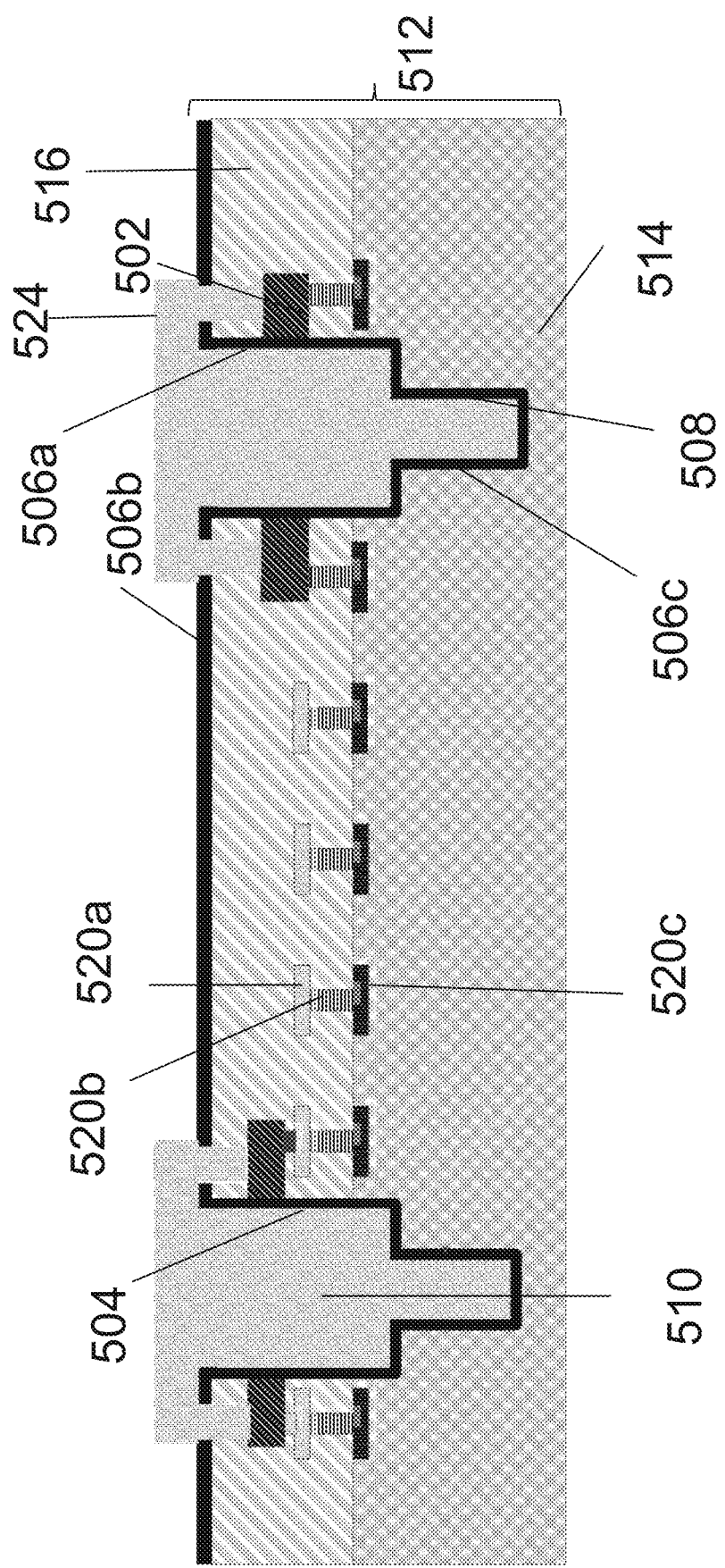
FIG. 5G shows forming of a redistribution layer according to various embodiments.

FIG. 5G shows forming of a redistribution layer according to various embodiments. The method may also include forming the redistribution layer (which may be referred to as a frontside (FS) redistribution layer) including the one or more electrically conductive lines 524 to electrically connect the exposed portion of the electrically conductive pad 502 and the exposed portion of the conductive via 510.

Figure 5H:
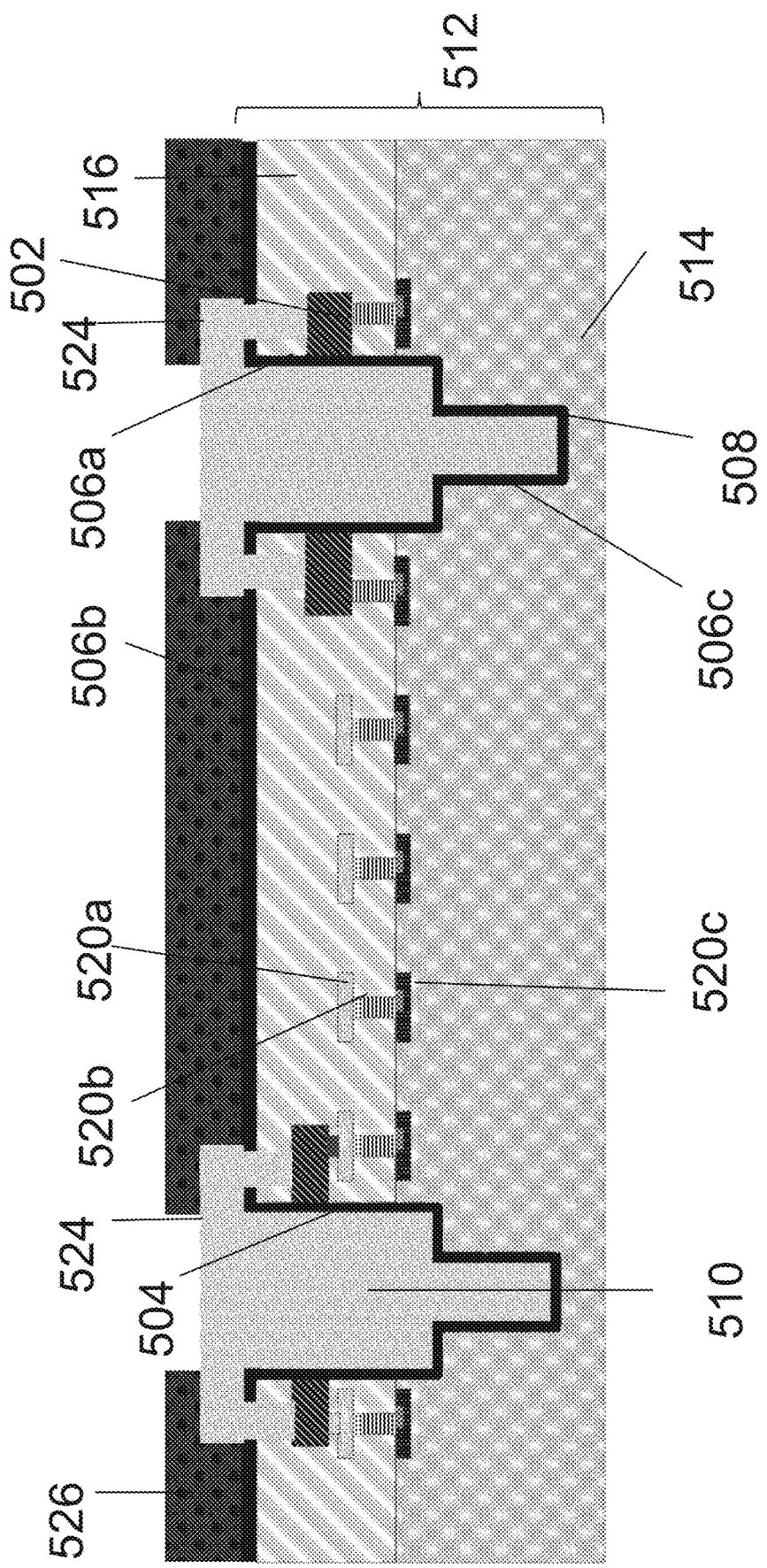
FIG. 5H shows patterning of a dielectric such as polyimide according to various embodiments.

FIG. 5H shows patterning of a dielectric 526 such as polyimide according to various embodiments. The method may include depositing the dielectric 526 such as polyimide such that the dielectric 526 is in contact with the one or more electrically conductive lines 524. The method may further include patterning the dielectric 526 such as polyimide to expose at least a portion of the one or more electrically conductive lines 524.

Figure 5I:
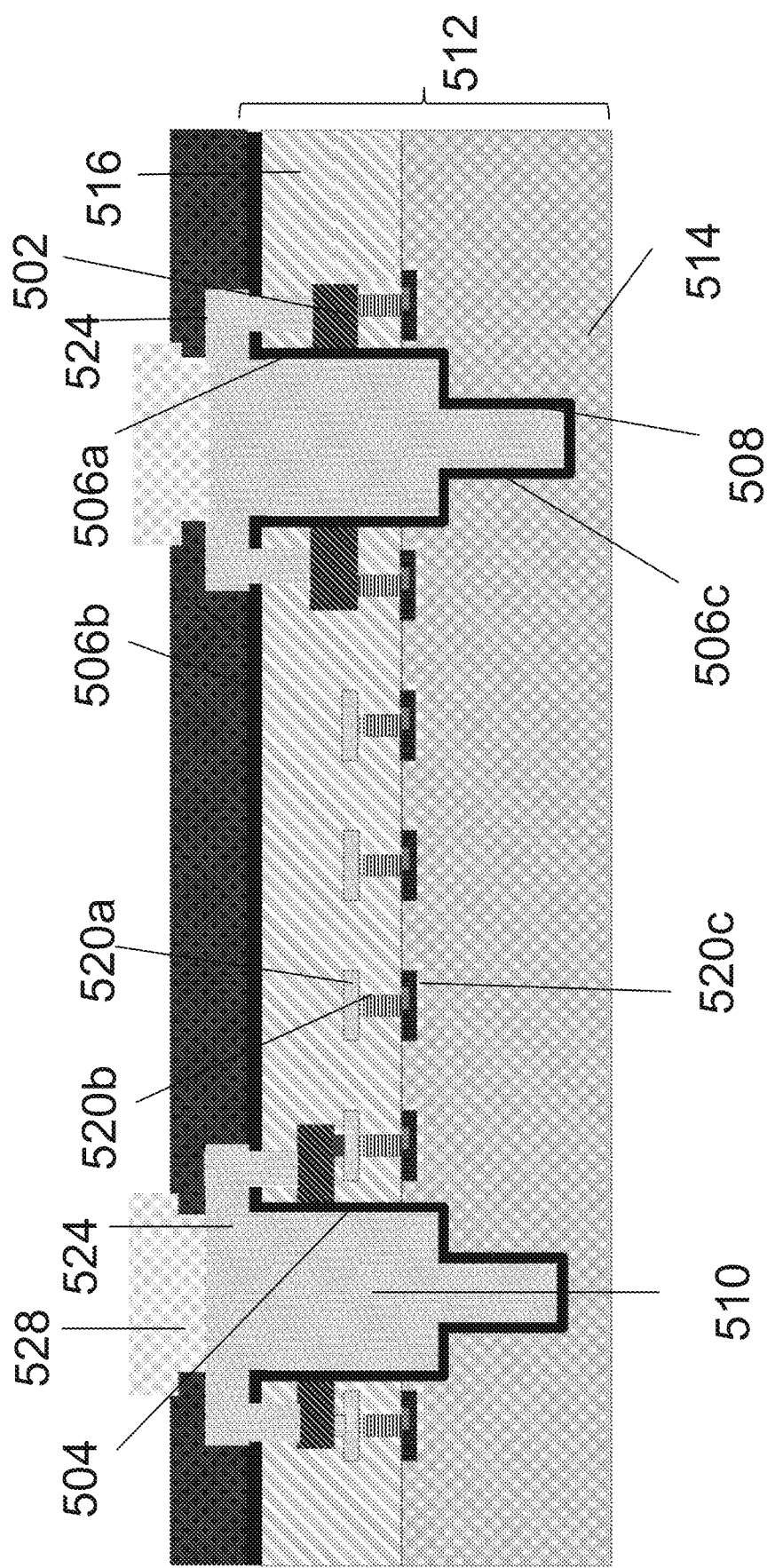
FIG. 5I shows forming of under bump metallization according to various embodiments.

FIG. 5I shows forming of under bump metallization 528 according to various embodiments. The method may include forming an under bump metallization 528 on the redistribution layer, i.e. on the exposed portion of the one or more electrically conductive lines 524. The under bump metallization 528 may be in contact with the one or more electrically conductive lines 524.

Figure 5J:
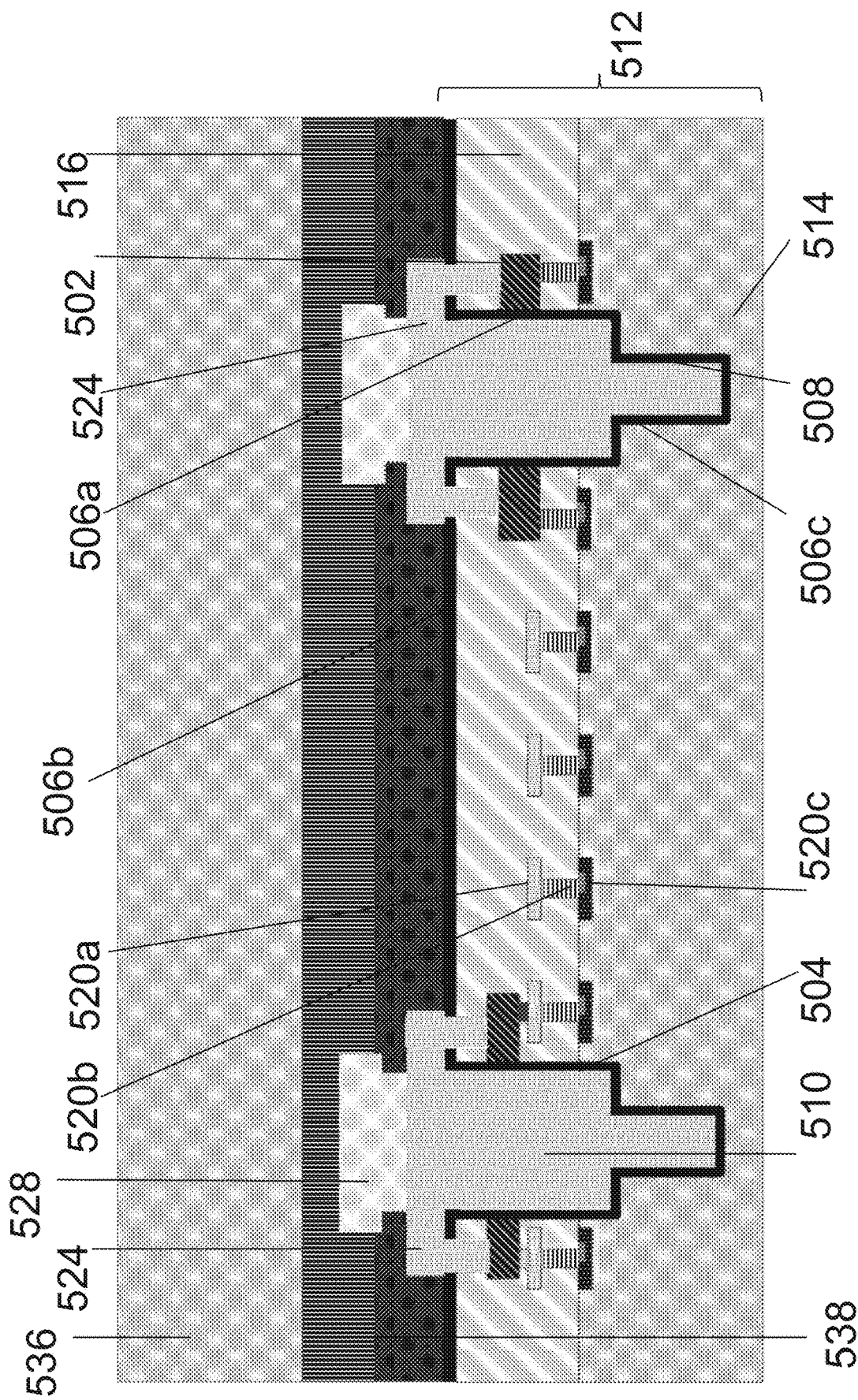
FIG. 5J shows temporary bonding using a temporary substrate according to various embodiments.

FIG. 5J shows temporary bonding using a temporary substrate 536 according to various embodiments. The temporary substrate 536, such as a silicon substrate or glass wafer, may be adhered to the dielectric layer 526 including polyimide as well as the under bump metallization 528 using an adhesive layer 538. The resultant structure may include the temporary substrate 536 and the substrate 512 being on opposing sides of the dielectric layer 526.

Figure 5K:
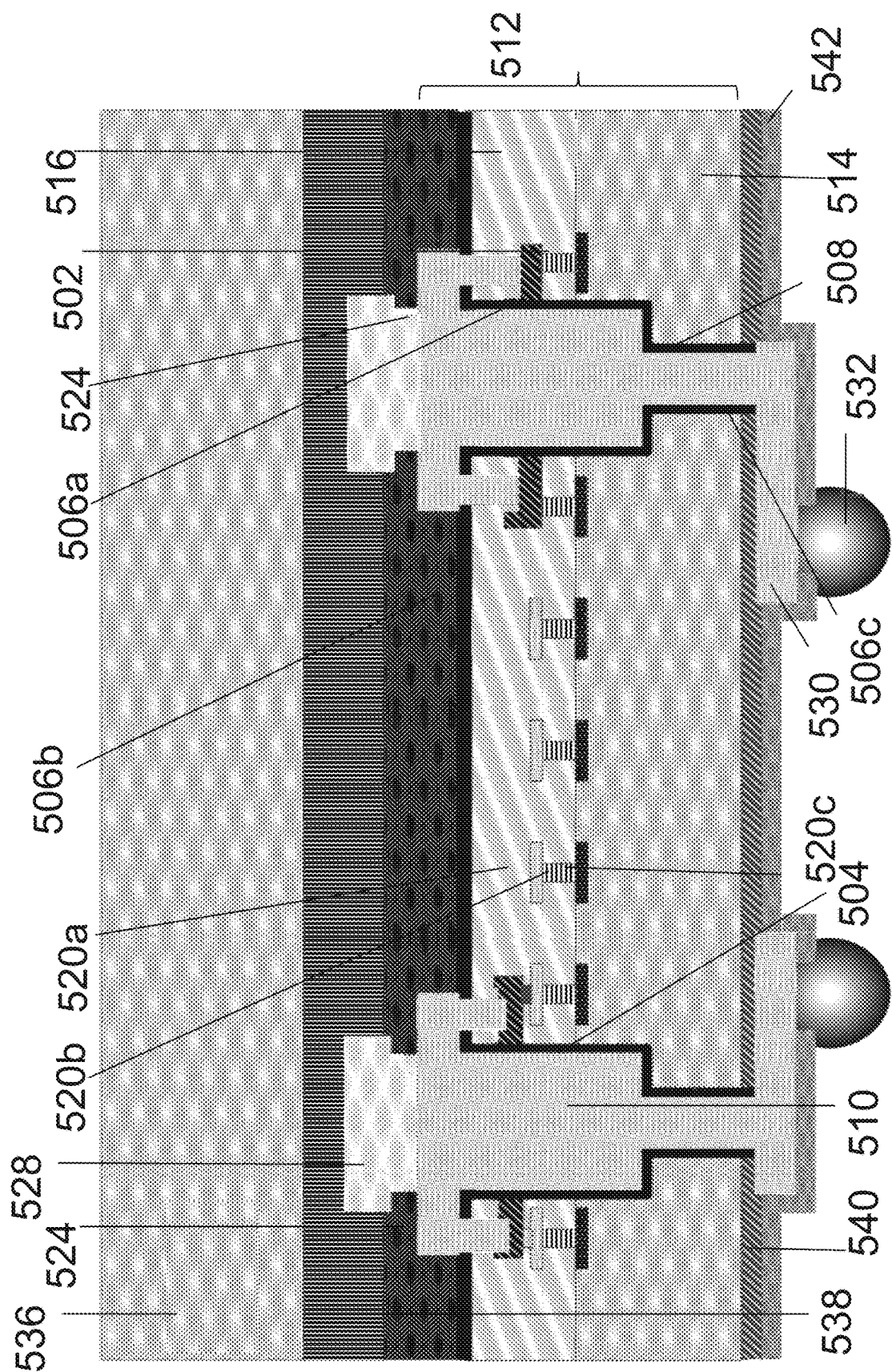
FIG. 5K shows forming of backside metallization according to various embodiments.

FIG. 5K shows forming of backside metallization according to various embodiments. The method may include removing a portion of the substrate 512 so that a back surface of the substrate 512 opposite the front surface is formed to expose the conductive via 510. The method may additionally include forming a backside metallization 530 so that the backside metallization 530 is in contact with the conductive via 510. The method may further include forming micro-bumps 532 in contact or in electrical connection with the backside metallization 530.

The one or more further dielectric liner layers 506c at a bottom surface of via hole may be removed by backside chemical mechanical polishing in the VLFT approach, which may be less of a challenge in terms of ease of processing.

The method may also include forming a first backside dielectric layer 540, e.g. including $SiO_2$, on the back surface of the substrate 512. The method may also include forming a second backside dielectric layer 542, e.g. including SiN, on the first backside dielectric layer 540.

Figure 5L:
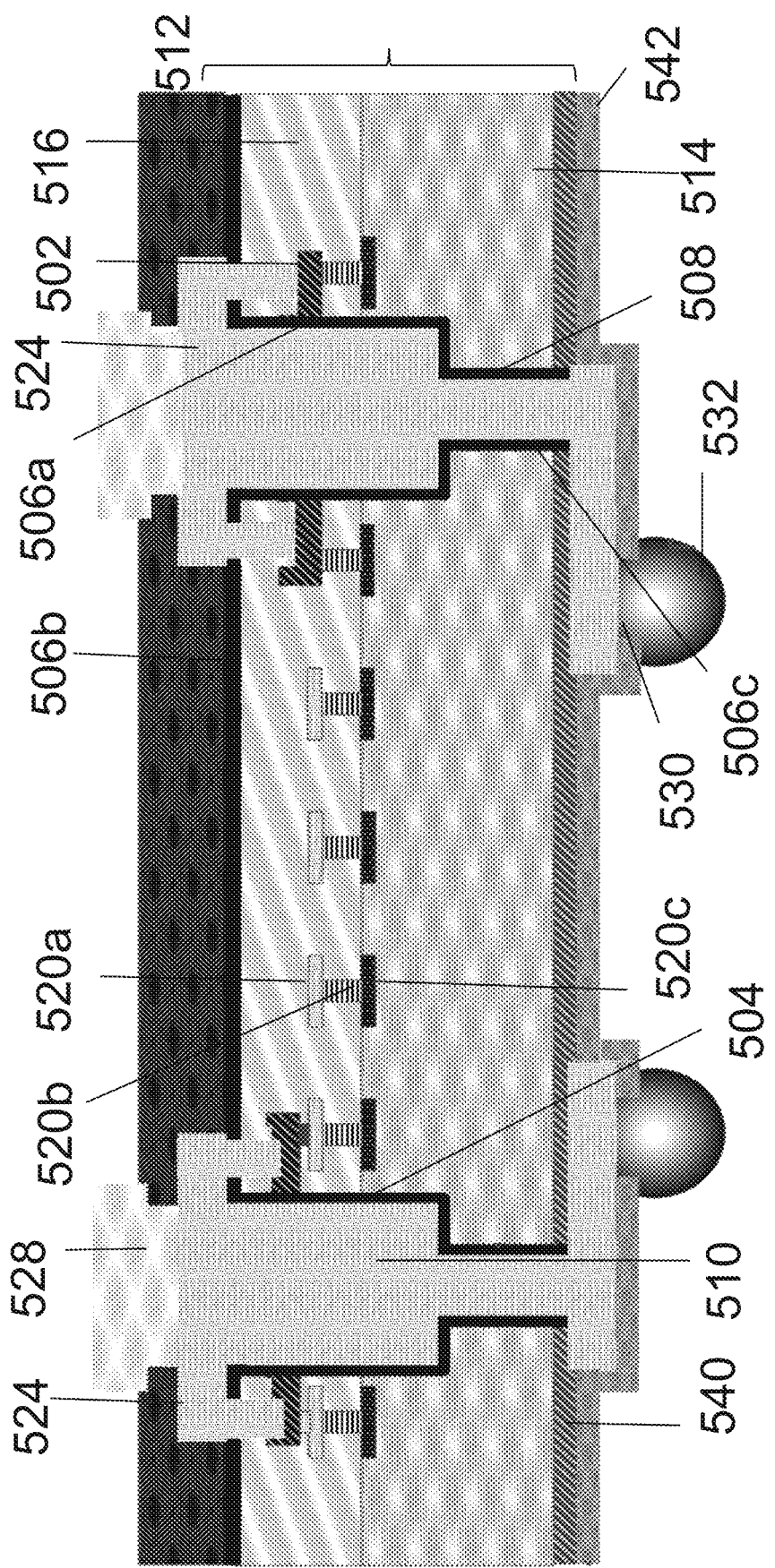
FIG. 5L shows wafer debonding according to various embodiments.

FIG. 5L shows wafer debonding according to various embodiments. During wafer debonding the temporary substrate 536 may be separated from the device including the substrate 512, the conductive via 510, the redistribution layer, the under-bump metallizations 528, 530 etc.

Various embodiments may involve designing and fabricating the via hole (or through silicon via (TSV) hole) and the cavity (or TSV cavity) on an existing electrically conductive pad, e.g. aluminium pad, copper pad.

The via hole (or through silicon via (TSV) hole) may be designed and fabricated from inside the cavity (or TSV cavity). The TSV mask may be positioned or arranged inside of the TSV cavity after thinning oxide coverage of the TSV cavity bottom and TSV cavity sidewall. In various embodiments, the TSV cavity size may be greater than the TSV hole. In various embodiments, the TSV cavity depth may be any value from 1 μm to 20 μm over-etching in the substrate. $SiN/SiO_2$ may be deposited inside of the TSV cavity, e.g. along the side walls of the cavity. Various embodiments may achieve maximum area and etch opening uniformity for the connection of the electrically conductive pad and the TSV.

Various embodiments may lead to cost saving that can be applied on existing devices, e.g. for 2.5 or 3 dimensional (3D) applications. Various embodiments may save space and reduce modification of design for 2.5 or 3 dimensional (3D) devices. In various embodiments, the TSV cavity may effectively reduce TSV sidewall roughness effects in the TSV etching process. Various embodiments may have reduced TSV effect within BEOL processes compared to TSV via middle (VM) approach. Various embodiments may have reduced TSV processes compared to TSV VLFB approach. Various embodiments may avoid the fabrication of TSVs on thinned wafers with carrier substrates. Various embodiments may allow processing or fabrication of TSV on top of silicon carrier even if the silicon carrier is not very smooth.

Various embodiments may be applied in or used by foundries and outsourced assembly and test, (OSAT) companies. OSAT companies may be able to develop and integrate various embodiments in existing devices. Various embodiments may reduce redesign cost and reduce requirement for thin wafer processing steps.

Various embodiments may be used in 3D memory stacks.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method of forming an electrical connection structure, the method comprising:
    forming a cavity on a front surface of a substrate, the substrate comprising an electrically conductive pad, by etching through the electrically conductive pad;
    forming one or more dielectric liner layers covering an inner surface of the cavity;
    providing a through via mask over the one or more dielectric liner layers after forming the one or more dielectric liner layers to cover the inner surface of the cavity and before forming a via hole so that the through via mask exposes at least a portion of the one or more dielectric liner layers covering a portion of a bottom surface of the cavity for subsequent forming of the via hole;
    forming the via hole extending from the cavity by etching through the one or more dielectric liner layers;
    forming one or more further dielectric liner layers covering an inner surface of the via hole; and
    depositing a suitable electrically conductive material into the cavity and the via hole to form a conductive via having a first portion in the cavity and a second portion in the via hole, a diameter of the first portion different from a diameter of the second portion.

2. The method according to claim 1, wherein a diameter of the first portion is greater than a diameter of the second portion.

3. The method according to claim 1, wherein forming the via hole comprises etching the portion of the one or more dielectric liner layers and the portion of the bottom surface of the cavity.

4. The method according to claim 1, further comprising:
    depositing an oxide over the front surface of the substrate and conducting chemical mechanical polishing (CMP) on the deposited oxide to form a planarized cover oxide layer before forming the cavity such that the planarized cover oxide layer is over the electrically conductive pad; and providing a cavity mask over the planarized cover oxide layer after forming the planarized cover oxide layer and before forming the cavity.

5. The method according to claim 4, wherein the cavity mask exposes a portion of the planarized cover oxide layer over a portion of the electrically conductive pad for etching of the portion of the planarized cover oxide layer and the portion of the electrically conductive pad to form the cavity.

6. The method according to claim 1, wherein the suitable electrically conductive material is selected from a group consisting of copper, tungsten, and doped polysilicon.

7. The method according to claim 1, further comprising:
forming a redistribution layer over the front surface of the substrate, the redistribution layer connecting the electrically conductive pad and the conductive via;
wherein the redistribution layer comprises one or more electrically conductive lines to electrically connect the electrically conductive pad and the conductive via.

8. The method according to claim 7, further comprising:
conducting chemical mechanical polishing (CMP) on the front surface of the substrate after depositing the suitable electrically conductive material;
forming a capping layer over the front surface of the substrate after conducting the chemical mechanical polishing (CMP);
providing a passivation mask over the capping layer so that at least a portion of the capping layer is exposed;
removing the portion of the capping layer and a portion of the substrate over a portion of the electrically conductive pad via etching so that the portion of the electrically conductive pad is exposed;
removing a remaining portion of the capping layer to expose the conductive via; and
forming the redistribution layer comprising the one or more electrically conductive lines to electrically connect the exposed portion of the electrically conductive pad and the exposed portion of the conductive via.

9. The method according to claim 7, further comprising:
forming an under bump metallization on the redistribution layer;
wherein the under bump metallization is in contact with the one or more electrically conductive lines.

10. The method according to claim 1, further comprising:
removing a portion of the substrate so that a back surface of the substrate opposite the front surface is formed to expose the conductive via.

11. The method according to claim 10, further comprising:
forming a backside metallization so that the backside metallization is in contact with the conductive via.

12. The method according to claim 1, wherein the electrically conductive pad comprises aluminum or copper.

13. The method according to claim 1, wherein the electrical connection structure is formed by a via last from top (VLFT) approach.

* * * * *